United States Patent [19]

Soliman

[11] Patent Number: 4,828,028

[45] Date of Patent: May 9, 1989

[54] METHOD FOR PERFORMING FRACTURING OPERATIONS

[75] Inventor: Mohamed Y. Soliman, Lawton, Okla.

[73] Assignee: Halliburton Company, Duncan, Okla.

[21] Appl. No.: 220,912

[22] Filed: Jul. 19, 1988

Related U.S. Application Data

[63] Continuation of Ser. No. 12,225, Feb. 9, 1987, abandoned.

[51] Int. Cl.$^4$ .............................................. E21B 43/26
[52] U.S. Cl. ..................................... 166/250; 166/280
[58] Field of Search ........................ 166/280, 308, 250

[56] References Cited

U.S. PATENT DOCUMENTS

| | | | |
|---|---|---|---|
| 3,126,056 | 3/1964 | Harrell | 166/280 |
| 3,164,208 | 1/1965 | McGuire, Jr. et al. | 166/280 |
| 3,224,506 | 12/1965 | Huitt et al. | 166/280 |
| 3,235,007 | 2/1966 | Kern et al. | 166/280 |
| 3,349,851 | 10/1967 | Huitt et al. | 166/280 |
| 3,709,300 | 1/1973 | Pye | 166/280 |
| 3,896,877 | 7/1975 | Vogt, Jr. et al. | 166/280 X |
| 4,078,609 | 3/1978 | Pavlich | 166/280 X |
| 4,109,721 | 8/1978 | Slusser | 166/280 |
| 4,378,845 | 4/1983 | Medlin et al. | 166/280 X |
| 4,398,416 | 8/1983 | Nolte | 73/155 |

OTHER PUBLICATIONS

Daneshy, A. A., "On the Design of Vertical Hydraulic Fractures," Reprinted from the Jan. 1973 issue of Jour. of Pet. Tech., pp. 83–97.

Perkins, T. K. and Kern, L. R., "Widths of Hydraulic Fractures," Jour. of Pet. Tech. & (Sep. 1961) pp. 938–949.

Daneshy, A. A., "Numerical Solution of Sand Transport in Hydraulic Fracturing," Jour. of Pet. Tech. (Jan. 1978). pp. 132–140.

Nolte, K. G., "Determination of Fracture Parameters from Fracturing Pressure Decline," SPE 8341, (Sep. 1979), pp. 1–16.

Primary Examiner—Stephen J. Novosad
Attorney, Agent, or Firm—Arnold, White & Durkee

[57] ABSTRACT

A method for modeling a fractured formation to determine a non-uniform fracture conductivity which will yield fracture performance comparable to that obtained from a fracture having uniform conductivity. Additionally, proppant concentrations and proppant schedules may be established to facilitate performing a fracturing operation to distribute sand in the fracture such that the fracture exhibits a non-uniform conductivity. The modeling technique includes the determining of an optimal fracture conductivity at a plurality of locations along the length of the fracture.

11 Claims, 5 Drawing Sheets

4,828,028

METHOD FOR PERFORMING FRACTURING OPERATIONS

This is a continuation of co-pending application Serial No. 012,225 filed on Feb. 9, 1987, now abandoned.

BACKGROUND OF THE INVENTION

The present invention relates generally to methods and apparatus for performing fracturing operations, and more specifically relates to methods and apparatus for modeling a fracture to determine a non-uniform conductivity in the fracture and for performing the fracturing operation by supplying proppant during the operation according to a schedule determined in response to a non-uniform conductivity in the fracture.

Various techniques or systems are used in the oil industry for increasing the production of oil or gas wells. One method known for stimulating a well is known as "hydraulic fracturing." During a typical hydraulic fracturing operation, a slurry including a viscous base fluid and a solid particulate material, particularly referred to as a "proppant," is pumped down the well at sufficient pressure to fracture open the producing formation surrounding the well. Once a fracture has been created, the pumping of the slurry is typically continued until a sufficient volume of the proppant has been carried by the slurry into the fracture. After a suitable time, the pumping operation is stopped, at which time the proppant residue will prop open the fracture in the formation, preventing it from closing. As a result of the fracture, the effective flow area from the producing formation is enlarged, thereby increasing the wells' production.

Typically, the slurry will be introduced into the well in stages, with each stage increasing in slurry volume and/or proppant concentration in the slurry. The repesentation of these volume stages and the accompanying proppant concentrations, is known as the proppant schedule.

The effectiveness of the fracturing operation is a function, in part, of the degree to which the propped fracture will allow fluid from the formation to flow from the formation, through the fracture to the well bore. This property is known as the conductivity of the fracture. The fracture conductivity is determined primarily by the size of the proppant particles and the volume of proppant within the fracture. The amount of proppant placed in the fracture must be sufficient to hold the fracture open. However, if too great a volume of proppant is placed in the fracture, the proppant will, in extreme cases, provide a relative barrier to fluid flow. A common disadvantage of utilizing a greater amount of sand than is actually needed is the increased possiblity of "sand out" (a blockage of the fracture due to excess sand), causing premature termination of the fracturing operation. Another common disadvantage resulting from placing too much proppant in the fracture is the potentially dramatic increase in the cost of the fracturing operation due to the cost of the excess proppant.

Prior art techniques of determining the proppant concentration for a particular fracture have been based upon achieving a uniform conductivity through the propped fracture. The ability of the propped fracture to conduct fluid is thus intended to be the same proximate the tip of the fracture as it is at the wellbore. Accordingly, proppant schedules developed in accordance with prior art techniques call for introducing proppant into the fracturing fluid in sufficient quantities to achieve a uniform conductivity. However, the flow rate through a fracture decreases with distance away from the wellbore. Thus, for any given fracture conductivity at the wellbore which is sufficient to produce hydrocarbons from a particular formation, a lesser conductivity will be sufficient to produce from the formation at locations of the fracture removed from the wellbore, since the flow rate through such locations is lower. The conductivity at such removed locations need only be sufficient to maintain a low pressure gradient towards the wellbore.

Accordingly, Applicant's invention provides a new method of modeling a fracture to determine a desired non-uniform conductivity over the length of the fracture and for determining a proppant concentration for a propped well in response to a desired non-uniform conductivity in the formation. This proppant concentration will yield flow characteristics from the fracture comparable to those achieved with a uniform proppant concentration. Thus, a proppant concentration determined in accordance with the present invention will facilitate fracturing a formation and propping the fracture with a reduced volume (and therefore cost), of proppant, relative to that required with prior art techniques, while achieving comparable flow characteristics from the fracture.

SUMMARY OF THE INVENTION

The present invention facilitates the distributing of a proppant, such as sand, within a fracture in varying concentrations to achieve a conduciivity in the fracture which changes along the length of the fracture. In a preferred embodiment, this conductivity will decrease in the fracture toward the tip of the fracture. The present invention provides a new method for modeling an earth fracture to establish non-uniform conductivities in the fracture as a function of location within the fracture. The modeling is preferably accomplished by simultaneously analytically solving a reservoir model and numerically solving a fracture model at a plurality of locations along the fracture. In response to the determined flow rate within the fracture at such loctions as determined by the model, the required permeability of the fracture at each location is modeled. In a preferred practice of the invention, the pressure gradient throughout the fracture is assumed to be generally constant. Accordingly, the permeability at each location is determined in reference to the flow rate and pressure gradient at the wellbore, with the fracture permeability at each location adjusted to accommodate the flow rate at that location while maintaining a constant pressure gradient.

Non-uniform conductivity within the fracture is obtained by establishing a proppant distribution within the fracture in response to the predetermined optimal non-uniform conductivity as a function of distance in the fracture from the wellbore. Preferably, this proppant distribution is determined by resolving a two-dimensional model of the fracture to determine fracture dimensions, and subsequently determining the appropriate proppant transport in relation to the desired conductivity for each of a plurality of locations in the fracture. Thus, the proppant at each location is determined in relation to the required areal proppant concentration and to the desired conductivity at that location. This proppant distribution is then utilized to determine a proppant schedule for the fracturing operation.

DETAILED DESCRIPTION OF THE PREFERRED EMBODIMENT

Figure 1:
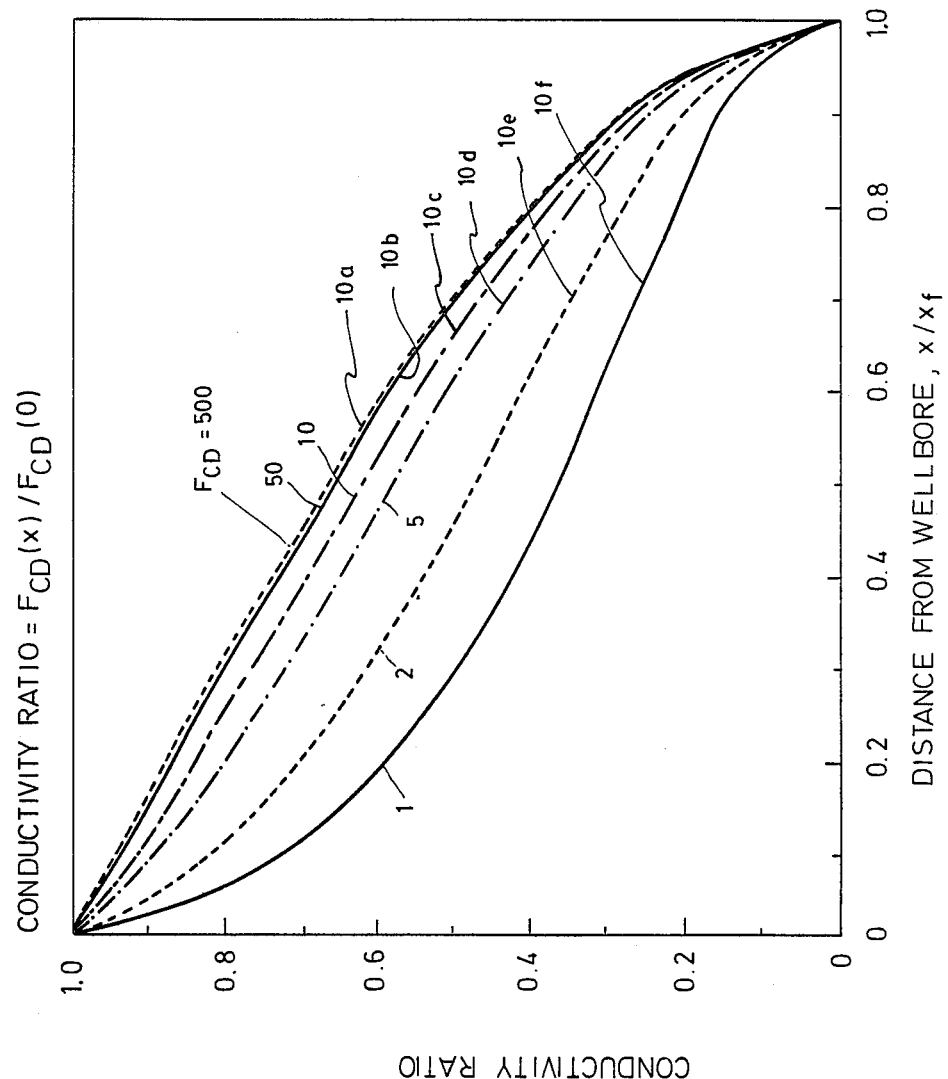
FIG. 1 graphically depicts exemplary ratios of fracture conductivity to distance within the fracture, as determined in accordance with the present invention.

Referring now to FIG. 1, therein are graphically depicted exemplary ratios of fracture conductivity to distance within a fracture as determined in accordance with the present invention. Each ratio curve 10a–10f is identified with the effective dimensionless fracture capacity ($F_{cD}$) at the wellbore which would be comparable to that ratio curve (or non-uniform conductivity distribution). The conductivity ratio of the ordinate of FIG. 1 represents the ratios of the dimensionless fracture capacity at a location "x" in the fracture ($F_{cD}(x)$) to the dimensionless fracture capacity at the wellbore. The exemplary ratios of fracture conductivity to fracture location of FIG. 1 have been determined through use of a mathematical model of a reservoir and fracture.

In accordance with the present invention, a formation has been mathematically modeled to determine a necessary permeability of the fracture at a plurality of locations within the fracture. These determined necessary fracture permeabilities within the fracture are then used to determine a corresponding dimensionless fracture conductivity for each such location within the fracture. The composite of these fracture conductivities, as previously determined, is represented by curves 10a–10f of FIG. 1.

In a preferred method of modeling in accordance with the present invention, a mathematical model of the unsteady state flow in the reservoir surrounding the fracture is solved analytically and is used to model the fluid flow characteristics from the reservoir into the fracture. These flow characteristics are then utilized to simultaneously solve, numerically, a mathematical model of the fracture to determine the fracture permeability ($k_f$) for the fracture. As indicated generally above, the model will be solved for a number of locations along the fracture length to determine the fracture permeability, and eventually the fracture conductivity, as a function of distance from the wellbore.

The reservoir and fracture models are based upon a series of assumptions as follows:

(a) The well intersects a symmetrical vertical fracture which penetrates the producing formation. This fracture has two dimensions, half length ($X_f$) and width ($2b$)

(b) The fracture conductivity is assumed to be a fuction of location within the fracture. Thus, the fracture conductivity is assumed to be different at the tip of the fracture than at the wellbore.

(c) The fracture communicates with the well through the entire formation thickness, and the fracture is the only path for fluid into the well bore.

(d) The well is producing from an isotropic, homogenous reservoir of a known permeability (k), porosity ($\phi$), and thickness (h).

(d) The reservoir is assumed to contain a slightly compressible fluid, of compressibility (c), and viscosity ($\mu$). Both compressibility and viscosity are independent of the reservoir pressure.

(e) The effects of gravity are negligible.

(f) The pressure gradient throughout the reservoir are very small, such that the square of the gradient is negligible.

(g) Laminar flow is assumed in the fracture.

The above assumptions facilitate the mathematical determination of a non-uniform conductivity distribution within a fracture which will allow the fracture to exhibit essentially the same flow characteristics as a fracture having uniform conductivity. The model disclosed and discussed below in relation to equations 1–18 is defined for modeling flow in an oil well and reservoir. The described technique may be utilized to model gas well and reservoir performance through substitution of equations descriptive of gas properties for the corresponding equations descriptive of oil properties in equations 1–18. Such corresponding equations are known to those skilled in the art. In accordance with the present invention, the model for the unsteady state flow in the reservoir may be represented by the relationship:

$$\frac{\partial^2 p}{\partial x^2} + \frac{\partial^2 p}{\partial y^2} = \frac{\phi \mu C_t}{k} \frac{\partial p}{\partial t} ; \qquad (1)$$

where $0 < x < x_f$ and $b < y < \infty$;

and $x_f < x < \infty$ and $0 < y < \infty$ and x and y represent dimensions of the abscissa and ordinate respectively; and p represents pressure in the formation;

$\phi$ represents porosity of the formation;

$\mu$ represents viscosity of fluid;

$C_t$ represents total compressibility in the formation;

k represents formation permeability; and t represents time.

In Equation 1, as in all other equations herein, a subscript "D" represents a dimensionless quality and a subscript "f" designates a parameter as being one of the fracture. The nomenclature for all equations in the reservoir/fracture flow model (equations 1–27) is consistent.

This reservoir model is then solved by solving equation 1 with a prescribed set of boundary conditions, as set forth in equations 2–10. As an initial condition:

$$p(x,y,0) = \text{the initial reservoir pressure } (p_i) \qquad (2)$$

The formation pressure in the reservoir is established equal to the pressure in the fracture:

$$p(x,b,t) = p_f(x,b,t) \quad (3)$$

The flow rate out of the reservoir is established equal to the flow rate into the fracture:

$$k \frac{\partial p}{\partial y}\bigg|_{y=b} = k_f \frac{\partial p_f}{\partial y}\bigg|_{y=b} \quad (4)$$

Thus, continuity in pressure is established across the face of the fracture, as well as a continuous rate of flow from the reservoir into the fracture.

The model is established on a quadrant, with the x axis running through the fracture and the y axis running through the wellbore. Equation 5 establishes that the model above the x-axis is symmetrical relative to that portion below the x-axis.

$$\frac{\partial p}{\partial y}\bigg|_{y=o} = 0 \text{ where: } x_f < x < \infty \quad (5)$$

As the point of reference moves to an infinite distance from the fracture, the pressure will be the initial reservoir pressure:

$$\lim_{y \to \infty} p = p_i \quad (6)$$

Complementary to the relation established in Equation 5, above, the model is established symmetrical relative to the y axis:

$$\frac{\partial p}{\partial x}\bigg|_{x=0} = 0 \text{ where: } b < y < \infty \quad (7)$$

Similar to the limits of Equation 6, as the point of reference moves away from the wellbore to an infinite distance, the pressure will be the initial reservoir pressure.

$$\lim_{x \to \infty} p = p_i \quad (8)$$

A condition is established that no fluid passes through the tip of the fracture along the x-axis:

$$\frac{\partial p}{\partial x}\bigg|_{x=x_f} = 0 \text{ where: } 0 < y < b \quad (9)$$

For simplification of the model, an assumption is made that there is no pressure differential at the tip of the fracture, and thus no fluid will pass between the reservoir and the fracture at the fracture tip.

$$p(x_f,y,t) = p_f(x_f,y,t); \text{ and: } 0 < y < b \quad (10)$$

Once equation 1 has been solved for that portion of the reservoir adjacent a predetermined location along the fracture, then the unsteady-state fracture flow model (equation 11) may be solved to determine the fracture permeability ($k_f$), as a function of pressure and location:

$$\frac{\partial^2 p_f}{\partial x^2} + \frac{\mu}{k_f} \frac{q_f(x,t)\beta}{bh} = \frac{\phi_f \mu C_{ft}}{k_f} \frac{\partial p_f}{\partial t} \quad (11)$$

where: $0 < x < x_f$ and:
- $p_f$ represents pressure in the fracture;
- $x_f$ represents the dimension of the cell along the fracture half-width;
- $q_f$ represents the well bore flow rate of the fracture;
- $\phi_f$ repesents porosity of the fracture;
- $C_{ft}$ represents total compressibility in the fracture;
- $p_f$ represents pressure in the fracture; and
- $t$ represents time; and
- $\beta$ represents a formation volume factor representing the ratio of the volume of the reservoir fluid at reservoir conditions, to the volume of the fluid at standard conditions (60° F.; 14.7 psia).

The fracture flow model of Equation 11 includes a set of boundaries (equations 12–17) similar to those established for the reservoir flow model. Initial conditions are set such that the pressure in the fracture as a function of position x (and o) equals the initial reservoir pressure:

$$p_f(x,0) = p_i \text{ where: } 0 < x < x_f \quad (12)$$

The fracture flow model may be solved for a constant flow rate. The pressure gradient at the wellbore will be known as a result of the known rate (q).

$$\frac{\partial p_f}{\partial x}\bigg|_{x=0} = -\frac{q\mu\beta}{4bk_f h} \quad (13)$$

As was defined in the reservoir model, there will be no fluid flow along the x-axis through the tip of the fracture:

$$\frac{\partial p_f}{\partial x}\bigg|_{x=x_f} = 0 \text{ where: } 0 < y < b \quad (14)$$

Also as with the reservoir flow model, no fluid flow will pass in either direction at the fracture tip:

$$p_f(x_f,y,t) = p(x_f,y,t) \text{ where: } 0 < y < b \quad (15)$$

As with the reservoir flow model, the fracture flow model will be established symmetrical around the y-axis:

$$\frac{\partial p_f}{\partial y}\bigg|_{y=o} = 0 \text{ where: } 0 < y < x_f \quad (16)$$

The flow rate of fluid into the fracture is established equal to the flow rate of fluid flow out of the reservoir (at the reservoir-fracture interface):

$$k_f \frac{\partial p_f}{\partial y}\bigg|_{y=b} = k \frac{\partial p}{\partial y}\bigg|_{y=b} \quad (17)$$

Once again, for the fracture flow model, the pressure in the fracture is established equal to the reservoir pressure at the fracture face.

$$p_f(x,b,t) = p(x,b,t) \text{ where: } 0 < x < x_f \qquad (18)$$

The simultaneous solution of the above model will yield the flow distribution from the reservoir into the fracture as well as the pressure distribution inside the fracture. Accordingly, the dimensionless flow capacity ($F_{CD}$) at each location along the wellbore may be determined:

$$F_{CD} = \frac{2bk_f}{kx_f} \qquad (19)$$

The pressure gradient is assumed to be generally constant throughout the fracture. The flow rate in the fracture will increase as the point of reference travels toward the wellbore from the tip of the fracture. Because of this difference in flow rate as a function of distance from the wellbore, if the conductivity at each location is uniform or too closely approaches uniform, the pressure gradient will deviate from the desired uniform pressure gradient. Accordingly, if the determined pressure gradient deviates too much from the desired uniform pressure gradient along the fracture, the conductivity at each location will be adjusted by a factor. This factor is defined as the pressure gradient at the location, or cell, in the fracture closest to the wellbore divided into the pressure gradient of another cell under consideration further away from the wellbore. Accordingly, the pressure gradient as determined from the model for the cell at the wellbore, may be utilized to reduce the fracture conductivity at the cell under consideration by the determined factor.

In one preferred embodiment, an acceptable limit for deviation in the pressure gradient is considered to be one percent to two percent. Typically, two iterations of the model will be sufficient to achieve an acceptable conductivity distribution. The model may be constructed by manual calculation, however, those skilled in the art will recognize that the model will preferably be constructed through use of conventional computer-assisted techniques.

EXAMPLE 1

Based upon the above-model, three fracture conductivity conditions have been compared: a uniform dimensionless fracture conductivity of 50; a dimensionless fracture conductivity decreasing linearly from 50 at the wellbore to 5 at the fracture tip; and a dimensionless fracture conductivity increasing linearly from 5 at the wellbore to 50 at the tip. The modeling was performed utilizing the assumption of a constant flow rate. The results of this comparison are graphically depicted in FIG. 2.

Figure 2:
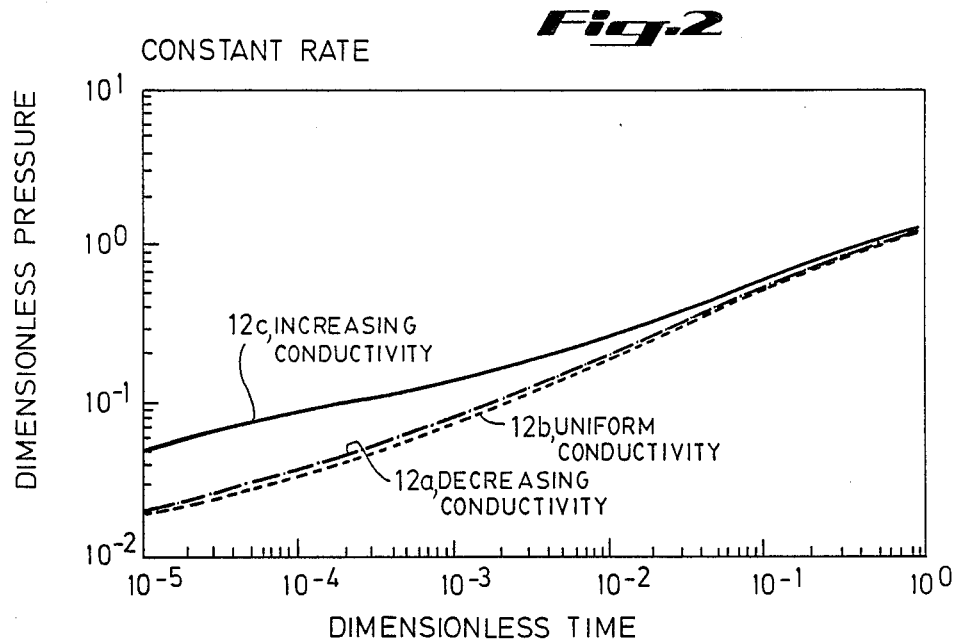
FIG. 2 graphically depicts the ratio of dimensionless pressure to dimensionless time in identical fractures with uniform conductivity and linearly increasing and decreasing conductivities, modeled upon the assumption of constant rate.

As can be seen from FIG. 2, the modeled pressure (dimensionless) of the fracture with linearly decreasing conductivity, represented by curve 12a, is comparable to the modeled pressure of the fracture of uniform conductivity, curve 12b Curve 12-C, depicting the pressure of the fracture with linearly increasing conductivity, reflects a substantially lower pressure.

EXAMPLE 2

Utilizing the same conductivity profiles as utilized for Example 1, the three fracture conductivity conditions were again compared, with the exception that a boundary condition of constant pressure was applied, rather than constant rate. The results of this modeling are graphically depicted in FIG. 3.

Figure 3:
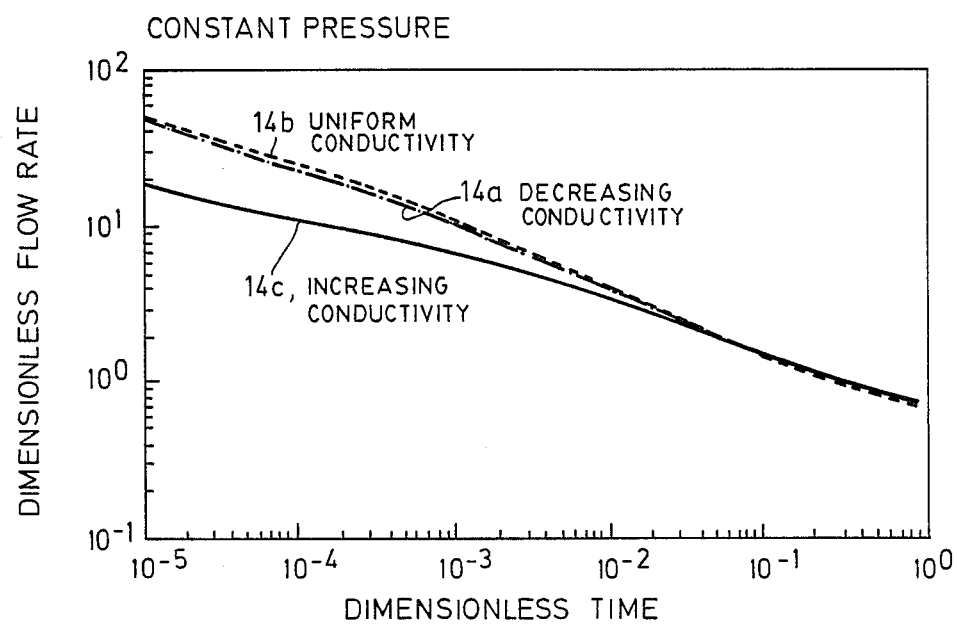
FIG. 3 graphically depicts the ratio of dimensionless flow rate to dimensionless time for fractures modeled with uniform conductivity and with linearly increasing and decreasing conductivities, modeled upon the assumption of constant pressure.

As can be seen in FIG. 3, the performance reflected by curve 14a, depicting the modeled performance of the fracture with linearly decreasing conductivity, is comparable to the modeled performance of the fracture of uniform conductivity, represented by curve 14b. Similarly to the results of FIG. 1, the performance, i.e., the flow rate of the modeled fracture of increasing conductivity, represented by curve 14c, was substantially lower.

As an example of an alternative technique to formation modeling in accordance with the present invention, the dimensionless fracture capacity ($F_{cD}$) may also be determined from a dimensionless model. In this alternative technique, the dimensionless reservoir flow model may be represented as:

$$\frac{\partial^2 p_D}{\partial x^2_D} + \frac{\partial^2 p_D}{\partial y^2_D} = \frac{\partial p_D}{\partial t_D} \qquad (20)$$

where:

$p_D$ represents dimensionless reservoir pressure as determined by:

$$p_D = \frac{kh(p_i - p)}{141.2q\beta\mu} \qquad (21)$$

$$\text{and: } x_D = \frac{x}{x_f} ; \qquad (22)$$

$$\text{and: } y_D = \frac{y}{x_f} ; \qquad (23)$$

and: $t_D$ represents dimensionless time, as determined by:

$$t_D = \frac{2.64 \times 10^{-4} kt}{\phi\mu C_t x^2_f} \qquad (24)$$

In dimensionless terms, the fracture flow model may be represented as:

$$\frac{\partial^2 p_{fD}}{\partial x^2_D} + \frac{2}{F_{CD}} \left. \frac{\partial p_D}{\partial y_D} \right|_{y_D=o} = \frac{1}{\eta_{fD}} \frac{\partial p_{fD}}{\partial t_D} \qquad (25)$$

where:

$p_{fD}$ represents the dimensionless fracture pressure, as determined by:

$$p_{fD} = \frac{kh(p_i - p_f)}{141.2q\beta\mu} \qquad (26)$$

and $\eta_{fD}$ represents dimensionless fracture hydraulic diffusivity, as determined by $$\eta_{fD} = \frac{k_f \phi C_t}{k\phi_f C_{tf}} \qquad (27)$$

As will be recognized by those skilled in the art, initial conditions and boundary conditions comparable to those discussed with respect to the geometric model should be imposed in solving the dimensionless model as represented by equations 20-27.

Once an optimal non-uniform fracture conductivity is determined, such as that depicted in FIG. 1, the proppant concentration for each location along the fracture to achieve the desired conductivity at that location may be determined. The proppant concentration will be determined in pounds per square foot. The conversion of a conductivity to a proppant, or sand, concentration may be accomplished through conventional prior art techniques known to those skilled in the art. However, contrary to prior art techniques, in accordance with the practice of the present invention, the proppant concentration will be determined for a plurality of locations along the fracture. Optimally, the sand concentration will be determined essentially continuously, for locations throughout the length of the fracture.

Figure 4:
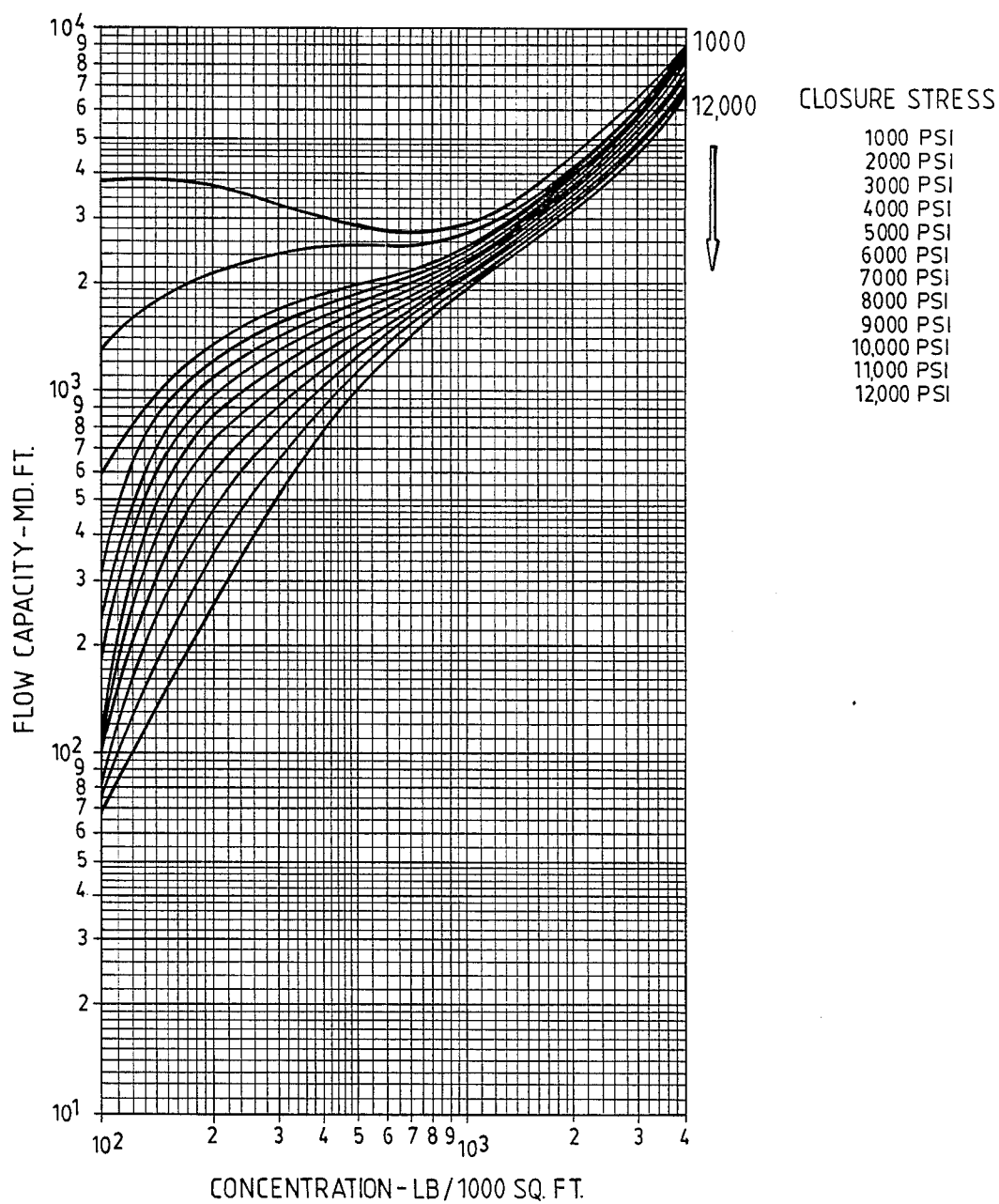
FIG. 4 graphically represents ratios necessary to determine proppant concentrations in a well in response to fracture characteristics.

Typically, individual proppants will have known characteristics from which the volume of proppant per given conductivity may be determined. For example, a schedule, such as that depicted in FIG. 4, may be consulted as to a particular proppant to facilitate the conversion of conductivity at a location in the fracture into the desired proppant concentration at that location.

Once the desired proppant concentrations along the fracture length are known, a proppant schedule will be determined to facilitate performance of the fracturing operation. In determining a proppant schedule for a fracturing operation, the basic fracturing operation will be designed through use of a fracturing model. The proppant schedule will be determined in response to the model, and in response to a non-uniform fracture conductivity curve, as depicted in FIG. 1. Those skilled in designing fractures will appreciate that different models may be utilized to determine a proppant schedule in response to the determined non-uniform fracture conductivity. In a particularly preferred embodiment of the present invention, the two-dimentional model is selected from either of the known models of Daneshy, or of Perkins and Kern. The Daneshy model is described in the article: "On the Design of Vertical Hydraulic Fractures," *The Journal of Petroleum Technology* (January 1973), pp. 83-93. The Perkins and Kern model is described in the article: "Widths of Hydraulic Fractures," *The Journal of Petroleum Technology* (September 1961), pp. 937-49. These articles are hereby incorporated by reference to demonstrate the state of the art. These models define the relationships between the fluid pumping time or volume and the created length and width of the fracture.

Figure 5:
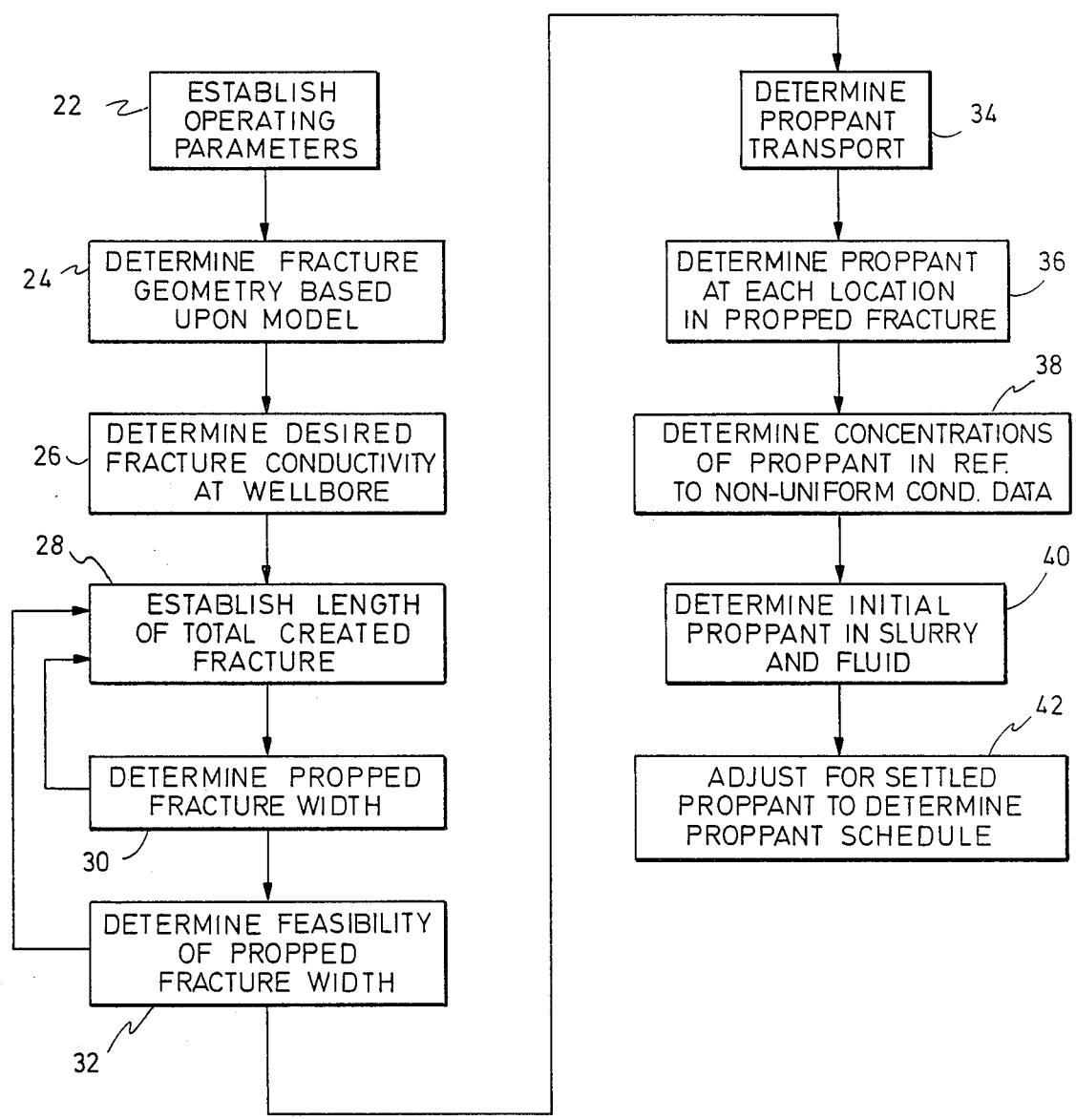
FIG. 5 graphically depicts a flow chart representing steps for determining a proppant schedule in accordance with the present invention.

Referring now to FIG. 5, therein is depicted a flow chart of a method for determining a proppant schedule for a fracturing operation in response to a desired curve of non-uniform fracture conductivity, in accordance with the present invention. As will be apparent from the discussion to follow, this method may be performed by manual calculations and manipulations of data. However, it is preferable that the model be constructed and the method be practiced using conventional computer-assisted techniques.

The initial step will be to establish the operating parameters for the model 22. These parameters will include physical dimensions of the reservoir, such as the wellbore diameter and well spacing; and well-known reservoir modelling parameters, such as, for example, formation permeability, porosity, fluid viscosity, etc. Additionally, parameters of the fracturing operation must be established. Such parameters include the characteristics of the fracturing fluid (i.e., the type of gel, the concentration of the gel, the specific gravity of the gel, et.); the allowable pumping rate; the rate of fluid loss to the formation, etc. Finally, the desired propped fracture length will be established.

Based upon the established operating parameters 22, the selected reservoir model will be utilized to determine the fracture geometry 24. This fracture geometry establishes relationships between the fluid pumping time or volume and the resulting length and width of the fracture, which may be used as the basic design for the fracturing operation.

Subsequently, the desired fracture conductivity at the wellbore is determined 26. This dimensionless fracture conductivity will be based upon the determined fracture length, the reservoir drainage, and wellbore radii. In a preferred practice of the present invention, the dimensionless fracture conductivity will be selected to be 98 percent of the maximum possible steady-state production increase which is possible, based upon the selected fracture length. It should be readily understood, however, that the fracture conductivity may be established according to any preferred criteria.

Figure 6:
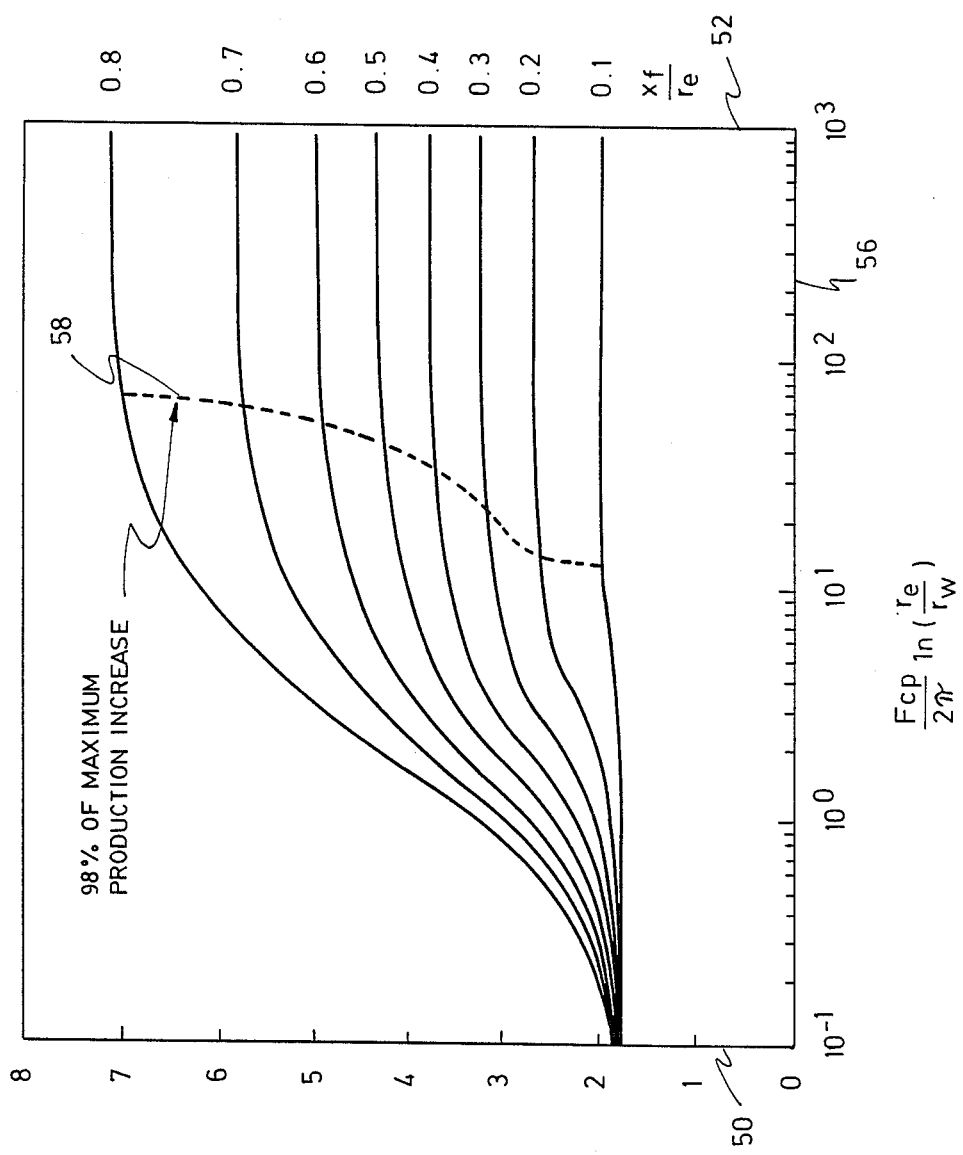
FIG. 6 graphically depicts the steady state relationship of the ratio of an unfractured well to a fractured well, relative to the length of the fracture and the fracture conductivity.

FIG. 6 graphically depicts the ratio of production between a fractured well and an unfractured well as a function of fracture conductivity. The left ordinate 50 of FIG. 6 represents the ratio of the productivity index (in bbl/psi-D) of a fractured system to the productivity index for the initial system, i.e., the ratio of performance of a fractured well to the unfractured well. This ratio is adjusted by a scaling factor, as known in the art, to compensate for the ratio between actual reservoir area and modeled reservoir area. The right ordinate 52 of FIG. 6 represents the ratioof the distance from the wellbore in the fracture to the drainage radius of the reservoir. The abscissa 56 of FIG. 6 represents, in essence, the dimensionless conductivity $F_{CD}$ of the fracture at the wellbore. Plotted line 58 defines the preferred guideline for selecting the fracture conductivity to provide 98% of the maximum production increase.

The selected dimensional fracture conductivity will become the effective conductivity for the fracture, i.e., the desired conductivity for that cell of the fracture adjacent to the wellbore. As indicated earlier herein, this desired conductivity for the cell adjacent the wellbore provides a partial basis for determining the non-uniform conductivity distribution throughout the half-length of the fracture.

In response to the determined fracture geometry 24, the total fracture length necessary to achieve that fracture geometry is established 28. As is known to those skilled in the art, the total created length of a fracture must be longer than the propped length of the fracture. In a preferred method for practicing the present invention, the total created fracture length will be initially selected to be 10 percent greater than the desired propped fracture length.

The propped fracture width will then be established 30. Based upon the established total fracture length 28, the fracture width at the outer extent of the propped fracture, upon completion of the fracturing operation, is determined 30. The feasibility of this fracture width must then be determined 32. Two constraints should preferably be placed upon the fracture width: (1) the created fracture width at any location with proppant will be greater than, for example, twice the diameter of the proppant particles and (2) the propped fracture width (that portion of the fracture having proppant) must e sufficient to attain the required conductivity at the wellbore using a feasible concentration of proppant in the slurry.

The first constraint (that the created fracture width be at least twice the diameter of the proppant particles) represents a safety factor to facilitate the passage of proppant through the fracture. The fracture width is related to the total fracture length, and thus, if the created fracture width is insufficient, an increased total fracture length must be established 28 which will yield the necessary propped fracture width.

The second constraint on the minimum fracture width, the minimum width of the propped fracture relative to conductivity, must also be considered. At the propped fracture width, the fracture width will be evaluated by determining the weight of the selected proppant per area of fracture face which will yield the desired conductivity. The ratio of this value to the maximum allowed proppant concentration in the slurry defines another minimum dimension for the fracture width. If the total created fracture length necessary to achieve this second minimal propped fracture width exceeds the previously established total fracture length 28, then such new length will be established as the total created fracture length.

In some circumstances, established parameters may require an extremely wide fracture to achieve a specific conductivity. This situation can occur when conditions dictate that a less than optimal proppant or a less than optimal maximum proppant concentration must be utilized for a specific operation. In such circumstances, physical constraints may dictate that a maximum allowable fracture length be established. This, of course, may serve to compromise optimal fracture design relative to the determined fracture width.

Once the total fracture length is finally established 28 then proppant transport determinations are made 34. The techniques for determining such proppant transport are known to those skilled in the art. The proppant transport determination establishes the volume of proppant in the various segments of the fracture. The determination involves considering the total fracturing slurry volume (determined in response to the determined total fracture length) as a plurality of incremental stages. The volume position and fluid loss to the formation of each stage is tracked in relation to the time of the intoduction of each stage into the fracture and its progress through the growing fracture. For example, proppant transfer determinations are described in the article by A. A. Daneshy: "Numerical Solution of Sand Transport in Hydraulic Fracturing," i The Journal of Petroleum Technology (January 1978), pp. 132-40. This article is hereby incorporated by reference to illustrate the state of the art. The proppant transport determination as described by Daneshy may be simplified somewhat for use with the present invention, as the proppant deposition along the bottom of the fracture during the transport should be disregarded at this time.

Once the positions and final volumes of each slurry stage in the fracture are determined, the height of the suspended proppant at locations in the wellbore will be determined 36. The height of the suspended proppant may be determined according to the relationship:

$$h_p(x) = h_f - \int_{t_e(x)}^{t_p} v_s dt \quad (28)$$

where:

$h_p(x)$ represents the height of the suspended proppant (in ft.);

x represents the distance from the wellbore (in ft.);

$t_p$ represents the pumping time (in min.);

$t_e$ represents the time at which fluid at a given position (x) entered the fracture (in min.);

$v_s$ represents the settling velocity of the proppant (in ft./min.);

t represents time (in min.); and subscript p represents suspended proppant in the fracture.

This nomenclature is consistent for each equation 28-34.

If the settling velocity is assumed to be constant, the determination of the height of the suspended proppant at location x ($h_p(x)$) may be simplified to:

$$h_p(x) = h_f - v_s(t_p - t_e(x)) \quad (29)$$

As can be seen from the above nomenclature, $(t_p - t_e(x))$ will represent the elapsed time of the fluid at position x in the fracture.

For each selected location x in the fracture, the areal proppant concentration for that location will be determined 36. This areal proppant concentration will be determined in response to optimal non-uniform conductivity data, as depicted in FIG. 1.

In a preferred means of practicing the invention, the non-uniform conductivity curves, such as those of FIG. 1, are fit by the least squares method with an eighth degree polynomial:

$$F_{CD}\left(\frac{x}{x_f}\right) = a_0 + a_1\left(\frac{x}{x_f}\right) + a_2\left(\frac{x}{x_f}\right)^2 + \ldots + a_8\left(\frac{x}{x_f}\right)^{(30)} \quad (30)$$

To allow accurate interpolation between the curves, the coefficients of equation 30 are additionally preferably curve fit, such as by:

$$a_j = A_{j,0} + \frac{A_{j,1}}{F_{CD}(O)} + \frac{A_{j,2}}{(F_{CD}(O))^2} \quad (31)$$

The coefficients of equation 31 are as follows:

TABLE 1

| COEFFICIENTS FOR DETERMINING CONDUCTIVITY DISTRIBUTION | | | |
|---|---|---|---|
| j | $A_{j,0}$ | $A_{j,1}$ | $A_{j,2}$ |
| 0 | $9.99464 \times 10^{-1}$ | $-4.43655 \times 10^{-4}$ | $-8.83417 \times 10^{-5}$ |
| 1 | $-4.14384 \times 10^{-1}$ | $-5.25973 \times 10^{0}$ | $9.86806 \times 10^{-1}$ |
| 2 | $-5.84872 \times 10^{0}$ | $3.57956 \times 10^{1}$ | $-3.26041 \times 10^{0}$ |
| 3 | $5.21518 \times 10^{1}$ | $-1.74178 \times 10^{2}$ | $1.47010 \times 10^{1}$ |
| 4 | $-2.27319 \times 10^{2}$ | $5.38424 \times 10^{2}$ | $-5.54036 \times 10^{1}$ |
| 5 | $5.35772 \times 10^{2}$ | $-1.00683 \times 10^{3}$ | $1.23600 \times 10^{2}$ |
| 6 | $-6.98779 \times 10^{2}$ | $1.10639 \times 10^{3}$ | $-1.56396 \times 10^{2}$ |
| 7 | $4.73969 \times 10^{2}$ | $-6.56647 \times 10^{2}$ | $1.04047 \times 10^{2}$ |
| 8 | $-1.30530 \times 10^{2}$ | $1.62310 \times 10^{2}$ | $-2.82746 \times 10^{1}$ |

Once the conductivities at each location have been established, the areal proppant concentrations needed at the selected locations to achieve those conductivities may be determined in a conventional manner.

The initial proppant concentration which will yield the desired conductivity distribution should be determined 40. For each given incremental stage, the final proppant concentration per volume of slurry ($C_{S,F}$), may be determined by the relationship:

$$C_{S,F} = \frac{c_A}{7.48 \, w(x,tp)} \quad (32)$$

where:

$c_A$ represents the areal proppant concentration (in lbs./sq. ft.); and w represents the propped fracture widths (in ft.).

With the initial and final slurry increment volumes known, the initial proppant concentration in the slurry $(C_{S,I})$, is determined from:

$$C_{S,I} = C_{S,F} \frac{V_{S,F}}{V_{S,I}} \quad (33)$$

where:

$V_{S,F}$ represents the final slurry volume (in gal.); and
$V_{S,I}$ represents the initial slurry volume (in gal.).

The initial proppant concentration in the fluid $(C_{F,I})$ is then determined from:

$$C_{F,I} = \frac{C_{S,I}}{1 - \frac{C_{S,I}}{\rho}} \quad (34)$$

where:

$C_{S,I}$ represents the initial proppant concentration in the slurry (in lbs./gal. of slurry); and $\rho$ represents the absolute density of the proppant (in lbs./gal.).

The determined slurry stages and proppant concentrations in the stages will then be adjusted in response to the proppant deposited on the bottom of the fracture 42. Beginning with the fluid stage which will, according to the model, be closest to the desired propped length of the fracture, the mass of the final suspended proppant in that stage is determined from the final position of the stage and the height and final concentration of the proppant in that stage. From the initial volume and proppant concentration in that stage, the initial proppant mass contained by the stage is determined. Subtracting the final proppant mass from the initial proppant mass gives the amount of proppant which is deposited by this stage along the bottom of the fracture. This mass will be numerically distributed among the stages which follow the stage under examination into the fracture. Subsequently, the initial proppant concentration for the fluid stage next closest to the wellbore is determined, considering any previously deposited proppant (as numerically distributed above), in the stage as contributing to the total proppant for that stage. Similarly, each fluid stage will be considered in sequence until the wellbore is reached.

Thus, a series of proppant concentrations may be determined in response to a series of desired decreasing fracture conductivities throughout the length of a fracture. Additionally, a proppant schedule for supplying proppant to the fracturing fluid may be determined for achieving a plurality of decreasing fracture conductivities approaching the tip of a fracture. This proppant schedule may be utilized directly, such as with computer controlled blenders to continuously vary the proppant concentration throughout the fracturing operation. Alternatively, the proppant concentration may be achieved through a pluraltiy of slurry stages of relatively reduced volume and/or increments of proppant concentration in the slurry, relative to existing techniques.

As an example of the practice of the present invention, proppant schedules have been determined for a selected formation and fracturing operation having characteristics as follows:

TABLE 2

| FORMATION PROPERTIES | |
|---|---|
| Formation height | 20 ft |
| Young's modulus | $6 \times 10^6$ psi |
| Permeability | 0.1 md |
| Closure stress | 6500 psi |
| Wellbore radius | 1.44 in |
| Drainage radius | 1320 ft |
| TREATMENT FLUID PROPERTIES | |
| Injection rate | 10 bpm |
| Treatment fluid specific gravity | 1.01 |
| n' of treatment fluid | 0.63 |
| K'$_a$ of treatment fluid | 0.05 lb$_f$-sec$^{n'}$/ft$^2$ |
| $C_{eff}$ | 0.0025 ft/$\sqrt{min}$ |

ESTABLISHED PARAMETERS

A propped fracture length of 1,000 ft. was selected with a fracture height of 50 ft. The proppant selected was 20/40 mesh intermediate strength. Fluid volume stages were established in accordance with conventional techniques at 500 gallon multiples and proppant concentrations were established in accordance with conventional techniques at increments of 2 pounds per gallon. A maximum surface proppant concentration of 16 pounds per gallon was specified.

EXAMPLE 3

Through use of the Daneshy model, the desired conductivity at the wellbore was determined to be 4130 md-ft. The total created fractured length was determined to be 1,098 feet, and the average fracture width was determined to be 0.625 inches and the average propped height of the fracture was determined to be 47.3 feet.

Using conventional techniques to establish a uniform conductivity of 4130 md-ft throughout the fracture, 2,418 sacks (241,800 pounds) of proppant would be required for the fracturing operation.

By supplying proppant in accordance with the present invention to achieve a non-uniform conductivity decreasing toward the tip of the fracture, the same proposed fracture operation was determined to require only 1,730 sacks (173,000 pounds) of proppant. Thus, 68,800 fewer pounds of proppant was determined to be required (a 28 percent decrease), for the fracturing operation. The proppant schedule established was as follows:

TABLE 3

| | |
|---|---|
| 27500 gal | pad volume (no proppant) |
| 14000 gal | with 2.0 lb proppant/gal. |
| 19000 gal | with 4.0 lb proppant/gal. |
| 11500 gal | with 6.0 lb proppant/gal. |
| 72000 gal | total fluid |
| 173,000 lbs. | total proppant |

EXAMPLE 4

The results from practice of the present invention can be even more dramatically improved by allowing smaller stage volumes and smaller increments of proppant concentrations. For example, on a well having the same design criteria and conductivity at the wellbore as stated for Example 3, with the exception of allowing proppant concentration increments of one pound per gallon, rather than the two pounds per gallon increments of Example 3, the total required proppant was reduced by a further 17,500 pounds to 155,500 lbs. It should be noted that 1,000 gallons more fluid was calculated to be needed to make up for the volume vacated by the decrease in the proppant volume.

The proppant schedule was determined as follows:

| | |
|---|---|
| 27500 gal | pad volume (no proppant) |
| 4000 gal | with 1.0 lb proppant/gal. |
| 10000 gal | with 2.0 lb proppant/gal. |
| 10500 gal | with 3.0 lb proppant/gal. |
| 9000 gal | with 4.0 lb proppant/gal. |
| 8000 gal | with 5.0 lb proppant/gal. |
| 4000 gal | with 6.0 lb proppant/gal. |
| 73000 gal | total fluid |
| 155,500 pounds | total proppant |

The difference in total proppant volumes is a function of the change in proppant concentration. For example, in Example 3, the first proppant containing stage consists of 14,000 gallons of fluid containing two pounds of proppant per gallon. In accordance with Example 2, the first 14,000 gallons of proppant-laden fluid includes a 4,000 gallon stage with one pound of proppant per gallon and a 10,000 gallon stage with two pounds of proppant per gallon.

Generally, smaller allowable increments in proppant concentrations and in stage volumes will result in reduced required amounts of proppant.

Many modifications and variations may be made in the techniqus and structures described and illustrated herein without departing from the spirit and scope of the present invention. For example, alternative techniques of modeling may be practiced to determine nonuniform conductivity distributions in a fracture. By way of illustration only, such alternative techniques may consider greater or fewer parameters or may rely upon assumptions which differ from those described herein. Accordingly, it should be readily understood that the foregoing description and drawings are illustrative only and are not to be considered as limiting of the present invention.

What is claimed is:

1. A method of establishing a proppant distribution within an earth fracture to be created by a fracturing operation, said fracture to intersect a wellbore, comprising:
   determining desired conductivities at a plurality of locations within said proposed fracture, said conductivities varying as as function of distance in said fracture from said wellbore; and
   establishing a proppant distribution within said fracture in response to said determined conductivities.

2. The method of claim 1, wherein said desired conductivities decrease in response to increased distance within said fracture from said wellbore.

3. The method of clamm 2, wherein said step of establishing said desired conductivities comprises the steps of:
   determining a fracture permeability for each of a plruality of locations within said fracture in response to flow throguh said fracture at each of said locations; and
   establishing a conductivity for each said location within said fracture in response to said determined fracture permeability for said locations within saids fracture.

4. The method of claim 1, wherein said step of establishing said desired conductivities comprises the steps of:
   determining a fracture permeability for each of a plurality of locations within said fracture in response to flow through said fracture at each of said locations; and
   establishing a conductivity for each said location within said fracture in response to said determined fracture permeability for said locations within said fracture.

5. A method of establishing a proppant schedule for a fracturing operation to create an earth fracture intersecting a wellbore, comprising the steps of:
   estimating the flow of fluid through said fracture at a plruality of locations within said fracture, said flow varying as a function of distance from said wellbore;
   establishing desired conductivities at a plurality of locations within said proposed fracture, said conductivitites varying as a function of the fluid flow at said locations;
   determining a proppant distribution within said fracture in response to said established desired conductivities; and
   establishing a proppant schedule for the fracturing operation, said proppant schedule adapted to place proppant in said fracture to generally establish said desired conductivities.

6. The method of claim 5, wherein said step of establishing desired conductivities comprises the steps of:
   determining fracture permeabilites for said locations within said fracture, sid fracture permeabilities determined in response to said estimated flow at said locations; and
   establishing said conductivites in response to said determined fracture permeabilities.

7. The method of lcaim 5, wherein said desired conductivities decrease in response to increased distance within said fracture from said wellbore.

8. A method for fracturing an earth formation with a fracturing fluid, comprising the steps of:
   estimating the flow into the fracture from the surrounding formation åt a plurality of locations along the proposed fracture;
   establishing a desired permeability for said fracture proximate said plurality of locations;
   determining the fracture conductivity proximate each said location in response to said established desired permeabilities at said locations;
   establishing a proppant schedule for introducing proppant into said fracturing fluid to establish said desired conductivities; and
   pumping said fracturing fluid and said proppant into said well in accordance with said proppant schedule to create said fracture and to distribute said proppant in said formation.

9. A method of fractuuring a well with a fracturing fluid, said fracture intersecting a wellbore, comprising the steps of:
   establishing a predicted flow from said formation into said fracture, said predicted flow established at a plurality of locations along said fracture;

establishing a permeability for said locations within said fracture to accommodate said predicted flow from said formations and to maintain a desired pressure gradient between adjacent locations along said fracture;

establishing a fracture conductivity at said locations in response to said determined fracture permeabilities at said locations;

establishing a proppant schedule for introducing proppant into said fracturing fluid during said fracturing operation in reference to said desired conductivities at said locations; and performing said fracturing operation substantially according to said established proppant schedule.

10. The method of claim 9, wherein said pressure gradient between adjacent locations is maintained generally constant along the length of said fracture.

11. The method of claim 9 wherein said conductivities for said locations decreases in response to distance from the wellbore.

* * * * *

UNITED STATES PATENT AND TRADEMARK OFFICE
CERTIFICATE OF CORRECTION

PATENT NO. : 4,828,028

DATED : May 9, 1989

INVENTOR(S) : Mohamed Y. Soliman

It is certified that error appears in the above-identified patent and that said Letters Patent is hereby corrected as shown below:

In column 2, line 32, "conduciivity" should read --conductivity--.

In column 6, line 65, insert --where: $0 < y < x_f$--.

In column 10, line 31, "ratioof" should read --ratio of--.

In column 10, line 66, after must delete "e" and in its place insert --be--.

In column 11, line 48, after Fracturing," delete "i".

In column 15, line 62, "clamm 2" should read --claim 1--.

In column 15, line 67, "througuh" should read --through--.

In column 16, line 43, "lcaim" should read --claim--.

In column 16, line 63, "fractuuring" should read --fracturing--.

Signed and Sealed this

Eighth Day of May, 1990

*Attest:*

HARRY F. MANBECK, JR.

*Attesting Officer*     *Commissioner of Patents and Trademarks*